(12) United States Patent
Haensch et al.

(10) Patent No.: US 7,479,410 B2
(45) Date of Patent: Jan. 20, 2009

(54) HYBRID-ORIENTATION TECHNOLOGY BURIED N-WELL DESIGN

(75) Inventors: Wilfried E. Haensch, Somers, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 11/760,836

(22) Filed: Jun. 11, 2007

(65) Prior Publication Data

US 2007/0232020 A1    Oct. 4, 2007

Related U.S. Application Data

(62) Division of application No. 11/161,861, filed on Aug. 19, 2005, now Pat. No. 7,250,656.

(51) Int. Cl.
   *H01L 29/72* (2006.01)
(52) U.S. Cl. .................. 438/123; 438/149; 438/150; 438/152; 438/198; 438/280
(58) Field of Classification Search ......... 438/123, 438/149, 150, 152, 198, 280
   See application file for complete search history.

(56) References Cited

U.S. PATENT DOCUMENTS

| | | | |
|---|---|---|---|
| 4,933,298 A | 6/1990 | Hasegawa | |
| 5,384,473 A | 1/1995 | Yoshikawa et al. | |
| 5,821,769 A | 10/1998 | Douseki | |
| 6,074,899 A | 6/2000 | Voldman | |
| 6,348,372 B1 | 2/2002 | Burr | |
| 2003/0209780 A1* | 11/2003 | Burr | 257/536 |
| 2005/0001290 A1 | 1/2005 | Chen et al. | |
| 2005/0073061 A1* | 4/2005 | Lee | 257/903 |
| 2006/0024931 A1 | 2/2006 | Chan et al. | |
| 2006/0157788 A1* | 7/2006 | Joshi et al. | 257/351 |

OTHER PUBLICATIONS

Yang, et al., "High Performance CMOS Fabricated on Hybrid Substrate With Different Crystal Orientations", IEEE IEDM 2003, pp. 18.7.1.-18.7.4.

* cited by examiner

*Primary Examiner*—Edward Wojciechowicz
(74) *Attorney, Agent, or Firm*—Scully, Scott, Murphy & Presser, P.C.; Anthony J. Canale

(57) ABSTRACT

A semiconductor structure is provided that includes a hybrid orientated substrate having at least two coplanar surfaces of different surface crystal orientations, wherein one of the coplanar surfaces has bulk-like semiconductor properties and the other coplanar surface has semiconductor-on-insulator (SOI) properties. In accordance with the present invention, the substrate includes a new well design that provides a large capacitance from a retrograde well region of the second conductivity type to the substrate thereby providing noise decoupling with a low number of well contacts. The present invention also provides a method of fabricating such a semiconductor structure.

11 Claims, 6 Drawing Sheets

US 7,479,410 B2

HYBRID-ORIENTATION TECHNOLOGY BURIED N-WELL DESIGN

RELATED APPLICATION

This application is a divisional application of U.S. patent application Ser. No. 11/161,861, filed on Aug. 19, 2005.

FIELD OF THE INVENTION

The present invention relates to a semiconductor structure, and more particularly to a semiconductor structure comprising a hybrid orientation (HOT) substrate having at least two coplanar surfaces of different surface crystal orientations, wherein one of said coplanar surfaces has bulk-like semiconductor properties and the other coplanar surface has semiconductor-on-insulator (SOI) properties, said HOT substrate including a new well design that provides a large capacitance from a well region to the substrate thereby providing noise decoupling with a low number of well contacts. The present invention also provides a method of fabricating such a semiconductor structure.

BACKGROUND OF THE INVENTION

In present semiconductor technology, CMOS devices, such as nFETs or pFETs, are typically fabricated upon semiconductor wafers, such as Si, that have a single crystal orientation. In particular, most of today's semiconductor devices are built upon Si having a (100) crystal orientation.

On one hand, electrons are known to have a high mobility for a (100) Si surface orientation, but holes are known to have a high mobility for a (110) surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area, and add capacitance, resulting in increased circuit delay and power.

On the other hand, hole mobility on (110) Si is 2× higher than on (100) Si; therefore, pFETs formed on a (110) surface will exhibit significantly higher drive currents than pFETs formed on a (100) surface. Unfortunately, electron mobility on (110) Si surfaces is significantly degraded compared to (100) Si surfaces.

As can be deduced from the above, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Hybrid orientation substrates having planar surfaces with different crystallographic orientation have recently been developed. See, for example, U.S. patent application Ser. No. 10/250,241, filed Jun. 23, 2003 and U.S. patent application Ser. No. 10/696,634, filed Oct. 29, 2003, the entire contents of each of the aforementioned U.S. Patent Applications are incorporated herein by reference. Additionally, hybrid-orientated metal oxide semiconductor field effect transistors (MOSFETs) have recently demonstrated significantly higher circuit performance at the 90 nm technology node. As discussed above, the electron mobility and hole mobility can be optimized independently by placing the nFET on a (100) surface and the pFET on a (110) surface.

In some versions of prior art hybrid orientation substrates, the HOT substrate provided includes a bulk-like region having an upper surface of a first crystallographic orientation and an SOI region having an upper surface of a second crystallographic orientation, wherein said second crystallographic orientation differs from said first. Such a structure is shown in FIG. 1 wherein reference numeral 10 denotes a lower semiconductor layer of a first crystallographic orientation, reference numeral 12 denotes a buried insulating layer, reference numeral 14 denotes an upper semiconductor layer of a second crystallographic orientation, which differs from said first, and reference numeral 16 denotes an epitaxially grown semiconductor layer. Reference numeral 18 denotes isolation regions that are used in separating the bulk-like regions from the SOI regions. The terms "bulk-like" and "SOI" are shown in the drawing to illustrate these different regions of the hybrid orientation substrate.

In such a hybrid orientation substrate, the pFETs are typically formed on the bulk-like regions, while the nFETs are formed on the SOI regions. It is also possible to reverse this situation, placing the pFETs in SOI regions, while placing the nFETs in bulk-like regions. In the following descriptions, the former case is described; however, it would be clear to one skilled in the state-of-the-art that this description is easily extended to include the later case, simply exchanging n-type and p-type regions (e.g., n-wells are replaced by p-wells).

Porting of SOI designs into hybrid orientation substrates requires extensive design modifications to add n-well contacts for pFETs. Such design modifications are disadvantageous because they tend to be costly and add extra time to the overall design manufacturing process.

Moreover, many of the prior art techniques that add n-well contacts to a hybrid orientation substrate incur limitations to effective suppression of electrical noise coupling among transistors via the n-well which can result in unsatisfactory operation of the CMOS circuits.

In view of the above, a technique is needed that can add wells and well contacts of a second conductivity type for FETs of a first conductivity type in a hybrid orientation substrate of the kind illustrated in FIG. 1 wherein the well contact provides a large capacitance from a well region to the underlying substrate thereby providing noise decoupling with fewer well contacts than what is typically used in prior art buried well designs. In particular, there is a need for providing an n-well contact for pFETs.

SUMMARY OF THE INVENTION

The present invention relates to a semiconductor structure including a hybrid orientation (HOT) substrate having at least two coplanar surfaces of different surface crystal orientations, wherein one of said coplanar surfaces has bulk-like semiconductor properties and the other coplanar surface has semiconductor-on-insulator (SOI) properties. Specifically, the hybrid orientation substrate of the present invention includes a novel well design that provides a large capacitance from a well region to the substrate thereby providing noise decoupling with a low number of well contacts. The present invention also provides a method of fabricating such a semiconductor structure.

In broad terms, the present invention provides a semiconductor structure that includes:

a substrate having a bulk layer of a first conductivity type, a portion of which is heavily doped, and including bulk regions and semiconductor-on-insulator regions; and a doped region of a second conductivity type abutting said heavily doped portion of said bulk layer and extending from a first of said bulk regions under a first of said semiconductor-on-insulator regions to a second of said bulk regions, said doped region electrically coupling a well region of said first bulk region and a well region of said second bulk region.

As indicated above, the present invention also provides a method of fabricating the above mentioned semiconductor structure. In general terms, the method of the present invention includes the steps of:

providing a hybrid orientation substrate having at least two coplanar surfaces of different surface crystal orientations, wherein one of said coplanar surfaces is a bulk semiconductor region and the other coplanar surface is a semiconductor-on-insulator (SOI) region;

forming a doped region of a second conductivity type in a bulk layer of a first conductivity type of the hybrid orientation substrate, said doped region is located beneath a buried insulator layer and extending from a first of said bulk regions under a first of said semiconductor-on-insulator regions to a second of said bulk regions; and forming semiconductor devices on each of said coplanar surfaces of different surface crystal orientations, wherein each semiconductor device in the bulk regions includes a well region, wherein the well region of said first bulk region and the well region of said second bulk region are electrically coupled by said doped region.

DETAILED DESCRIPTION OF THE INVENTION

Figure 1:
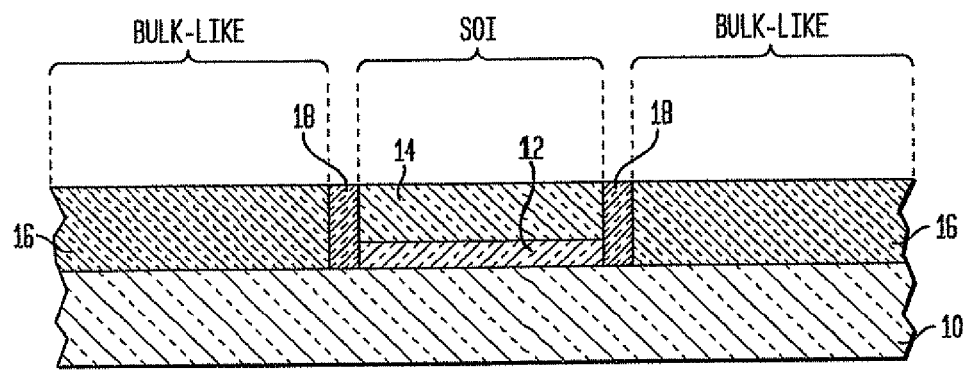
FIG. 1 is a pictorial representation (through a cross sectional view) illustrating a prior art hybrid orientation substrate.

The present invention, which provides a buried well design for a hybrid orientation (HOT) substrate having bulk-like regions and SOI regions, will now be described in greater detail by referring to the drawings that accompany the present application. The accompanying drawings are provided for illustrative purposes and thus they are not drawn to scale.

FIGS. 2A-2E illustrate a process flow for a first embodiment of the present invention. The process flow of the first embodiment of the present invention begins with first providing an initial HOT substrate 50 containing bulk regions 52 having an upper surface of a first crystallographic orientation and SOI-like regions 54 (e.g., SOI regions 54) having an upper surface of a second crystallographic orientation which differs from said first. More specifically, the hybrid orientation substrate 50 shown in FIG. 2A includes a first semiconductor layer 56 of a first conductivity type having a first crystallographic orientation, a second semiconductor layer 58 of said first conductivity type and said first crystallographic orientation atop said first semiconductor layer 56. Atop the second semiconductor layer 58 are the bulk regions 52 and the SOI regions 54. The exact number of bulk regions 52 and SOI regions 54 can vary depending on the number of devices that will be formed atop the structure of the present invention provided that at least one SOI region 54 is present atop the second semiconductor layer 58. In a general structure including a single SOI region 54, the SOI region 54 will be abutted on each side, i.e., flanked, by a bulk region 52.

In accordance with the present invention, the bulk regions 52 have the same crystallographic orientation as layers 56 and 58. The bulk regions 52 comprise at least one epitaxial regrown semiconductor material 60. The SOI regions 54 comprise a buried insulating layer 62 located atop surface portions of the second semiconductor layer 58 and at least a third semiconductor layer 64 located atop the buried insulator 62. As shown the bulk regions 52 are separated from the SOI regions 54 by a spacer 66.

Figure 2A:
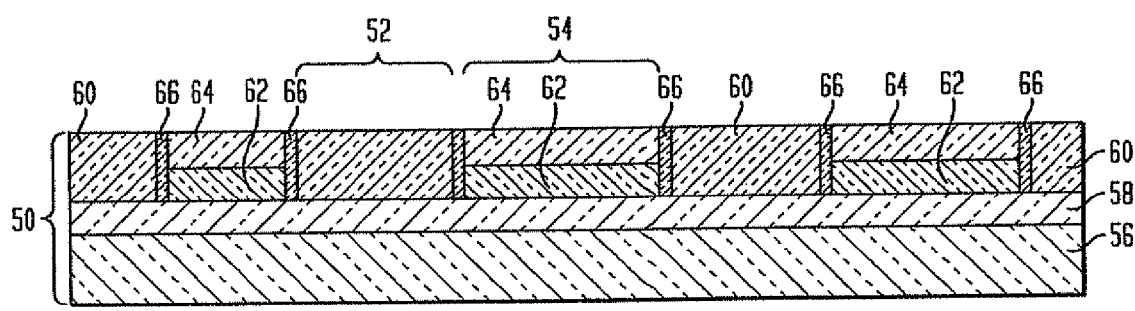
FIGS. 2A-2E are pictorial representations (through cross sectional views) illustrating one embodiment of the present invention.

The hybrid substrate 50 shown in FIG. 2A is formed by first forming via an epitaxial growth process the second semiconductor layer 58 atop the first semiconductor layer 56. In accordance with the present invention, the first semiconductor layer 56 is of a first conductivity type, i.e., n- or p-type, preferably p-type. The first semiconductor layer 56 comprises an as-grown highly doped portion (>$10^{19}$ atoms/cm$^3$) with an undoped or lightly doped (~$10^{15}$ atoms/cm$^3$) region disposed above said highly-doped portion. Typically, and for the case of a p-type semiconductor layer, the dopant concentration within the first semiconductor layer 56 is about $10^{19}$ atoms/cm$^3$ or greater, with a p-type dopant concentration from about $3\times10^{19}$ to about $1\times10^{21}$ atoms/cm$^3$ being more typical. When n-type semiconductors are desired, the dopant concentration within the first semiconductor layer 56 is about $10^{19}$ atoms/cm$^3$ or greater, with an n-type dopant concentration from about $3\times10^{19}$ to about $1\times10^{21}$ atoms/cm$^3$ being more typical. The thickness of the first semiconductor layer 56 is typically within ranges of a conventional bulk semiconductor wafer, i.e., on the order of about 100 to about 500 μm.

As stated above, the second semiconductor layer 58 is formed atop the first semiconductor layer 56 utilizing a standard epitaxial growth technique. The second semiconductor layer 58 is of the same conductivity type as that of the first semiconductor layer 56. The dopants are typically introduced via ion implantation after the epitaxial growth process that is used in forming the second semiconductor layer 58. Although the second semiconductor layer 58 is of the same conductivity type as that of the first semiconductor layer 56, the second semiconductor layer 58 has a lower dopant concentration than that of the first semiconductor layer 56. Typically, and for the case of a p-type semiconductor layer, the dopant concentration within the second semiconductor layer 58 is from about $5\times10^{15}$ to about $1\times10^{19}$ atoms/cm$^3$, with a p-type dopant concentration from about $6\times10^{17}$ to about $6\times10^{18}$ atoms/cm$^3$ being more typical. When n-type semiconductors are desired, the dopant concentration within the second semiconductor layer 58 is from about $5\times10^{15}$ to about $1\times10^{19}$ atoms/cm$^3$, with an n-type dopant concentration from about $6\times10^{17}$ to about $6\times10^{18}$ atoms/cm$^3$ being more typical. The thickness of the second semiconductor layer 58 may vary depending on the conditions of the epitaxial growth process. Typically, the thickness of the second semiconductor layer 58 is from about 20 to about 2000 nm, with a thickness from about 50 to about 100 nm being even more typical.

The first and second semiconductor layers (i.e., layers 56 and 58, respectively) are comprised of the same or different, preferably the same semiconductor material. Illustratively, the first and second semiconductors 56 and 58 may include, for example, Si, SiC, SiGe, SiGeC, Ge alloys, GaAs, InAs, InP, as well as other III/V or II/VI compound semiconductors. Preferably, the first and second semiconductor layers 56 and 58 are comprised of a Si-containing semiconducting material, with Si being highly preferred.

Another characteristic feature of the first and second semiconductor layers 56 and 58 is that they have the same crystallographic orientation. That is, layers 56 and 58 have a first crystallographic orientation, including any of the major or minor Miller indices. Typically, and for Si-containing semiconductors, the first crystallographic orientation is one of (110), (111) or (100), with (110) for p-type semiconductors being highly preferred in the present invention.

A layer of silicon dioxide is optionally grown or deposited on semiconductor layer 58. After providing the second semiconductor layer 58 on the first semiconductor layer 56, a substrate (not shown) including a dielectric material such as, for example, an oxide or nitride atop a third semiconductor layer 64 is provided by conventional techniques well known to those skilled in the art. For example, the dielectric material can be formed atop the third semiconductor layer 64 via a conventional deposition process such as, for example, chemical vapor deposition or plasma enhanced chemical vapor deposition. Alternatively, the dielectric material can be formed atop the third semiconductor layer 64 by thermal oxidation or thermal nitridation.

It is observed that the dielectric layer of this substrate becomes the buried insulating layer 62 mentioned above. The thickness of the buried insulating layer 62 may vary depending upon the technique used in forming the same. Typically, the buried insulating layer 62 has a thickness from about 10 to about 200 nm, with a thickness from about 50 to about 150 nm being even more typical.

The third semiconductor layer 64 of this substrate may include the same or different semiconductor material as that of the first and second semiconductor layers 56 and 58. Typically, the third semiconductor layer 64 is a Si-containing semiconducting material, with Si being highly preferred. The third semiconductor layer 64 has a second crystallographic orientation that is different from the first crystallographic orientation of the first and second semiconductor layers 56 and 58. When the third semiconductor layer 64 is comprised of a Si-containing semiconductor, the third semiconductor layer 64 may have a (100), (111) or (110) crystallographic orientation. In a preferred embodiment, and when the first and second semiconductor layers 56 and 58 have a (110) crystallographic orientation, then the third semiconductor layer 64 has a (100) crystallographic orientation. The third semiconductor layer 64 typically has a thickness from about 2 to about 200 nm, with a thickness from about 5 to about 100 nm being even more typical.

The structure containing semiconductor layers 56 and 58 and the substrate (now shown) including the third semiconductor layer 64 and the dielectric material 62 are then bonded together by first bringing the dielectric material 62 of the substrate in contact with the second semiconductor layer 58, or with the optional silicon dioxide layer disposed on second semiconductor layer 58. An optional external force can be applied during the initial contact step as well as during a heating step that follows. The two structures are then bonded by heating. The heating step is typically performed in an inert ambient at a temperature from about 200° C. to about 1050° C. for a time period from about 2 to about 20 hours. More typically, bonding is performed at a temperature from about 200° C. to about 400° C. for a time period from about 2 to about 20 hours. The term "inert ambient" is used in the present invention to denote an atmosphere in which an inert gas, such as He, Ar, Ne, $N_2$, Xe, Kr or a mixture thereof, is employed. Typically, the inert ambient is a $N_2$-containing ambient. It is noted that the above conditions are typical conditions that can be used in bonding two structures together. Other conditions, such as room temperature bonding, are also contemplated in the present invention.

Following the bonding process, some material layers of either the first or third semiconductor layers can be removed utilizing techniques well known in the art. For example, a splitting anneal can be used to remove some material from the first semiconductor layer 56 provided that the first semiconductor layer includes a $H_2$ implantation region therein. Chemical mechanical polishing and/or grinding can be used to thin the third semiconductor layer 64 at this point of the present invention. Alternatively, the third semiconductor layer 64 can be thinned by oxidation and etching.

The hybrid orientation substrate 50 is then formed by forming a mask (not shown) atop the third semiconductor layer 64. The mask protects portions of the bonded structure, while other portions of the bonded structure are left exposed. The protected portions of the bonded structure define the SOI regions 54, while the unprotected portions of the bonded structure define the bulk regions 52. The mask can be comprised of a conventional photoresist material or a nitride or oxynitride layer. The mask is typically formed by conventional deposition and lithography. An etching process such as reactive ion etching can be used to provide a nitride- or oxynitride-containing mask.

Next, one or more etching steps are performed in the regions not protected by the mask so as to expose the second semiconductor layer 58. Specifically, the one or more etching steps used at this point of the present invention removes the exposed third semiconductor layer 64 as well as underlying portions of the buried insulating layer 62, exposing an upper surface of the second semiconductor layer 58. The one or more etching steps used to expose portions of the second semiconductor layer 56 may include a dry etching process such as, for example, reactive-ion etching, ion beam etching, plasma etching or laser etching, a chemical wet etch process or any combination thereof. Typically, a reactive ion etch is used to selectively expose portions of the second semiconductor layer 56. Note that the sidewalls of the protected SOI regions 54, i.e., the third semiconductor layer 64 and the buried insulating layer 62, are exposed after this etching step.

The mask is then removed from the structure utilizing a conventional resist stripping process and then a liner or spacer 66 is formed on the exposed sidewalks. The liner or spacer 66 is formed by deposition and etching. The liner or spacer 66 is comprised of an insulating material such as, for example, an oxide.

After forming the liner or spacer 66, a semiconductor material 60 is formed on the exposed second semiconductor layer 58. In accordance with the present invention, semiconductor material 60 has a crystallographic orientation that is the same as the crystallographic orientation of the second semiconductor layer 58. The semiconductor material 60 may comprise any Si-containing semiconductor, such as, for example, Si, strained Si, SiGe, SiC, SiGeC or combinations thereof; which is capable of being formed utilizing a selective epitaxial growth method. In some preferred embodiments, semiconductor material 60 is comprised of Si. In other preferred embodiments, the semiconductor material 60 is a strained Si layer that is located atop a relaxed SiGe alloy layer. In the present invention, semiconductor material 60 may be referred to as a regrown epitaxial semiconductor material.

Next, the structure is subjected to a planarization process such as chemical mechanical polishing (CMP) or grinding such that the upper surface of the semiconductor material 60 is substantially planar with the upper surface of the third semiconductor layer 64.

The above description details how to fabricate the structure shown in FIG. 2A. It is noted that the further details concerning fabrication of the HOT substrates initially employed in the present invention can be found in U.S. patent application Ser. No. 10/250,241, filed Jun. 23, 2003 and U.S. patent application Ser. No. 10/696,634, filed Oct. 29, 2003, the entire contents of each of the aforementioned U.S. Patent Applications were previously incorporated herein by reference.

Figure 2B:
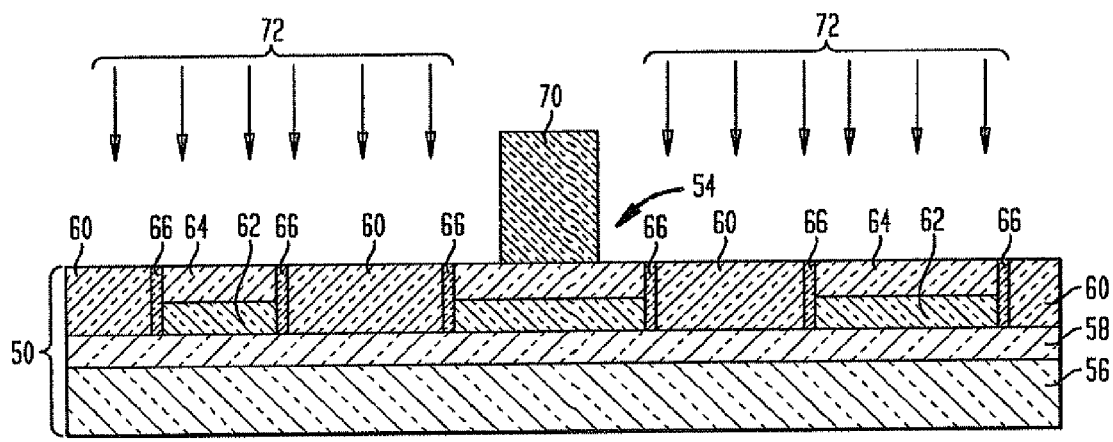

Next, and as shown in FIG. 2B, a patterned resist 70 is formed on the surface of the hybrid substrate 50 utilizing a conventional deposition process and lithography. The patterned resist 70 is formed over one of the SOI regions 54 of the hybrid substrate 50. After forming the patterned resist 70, retrograde well regions 74 of said second conductivity type are implanted into the structure. The term "retrograde well region" is used in the present invention to denote a doping region that is characterized by having a doping concentration which is significantly below the surface of the semiconductor, compared to that nearby the surface. In the drawings, a single retrograde well region 74 is located beneath a single SOI region 54 which is flanked, on the other side, by a bulk region 52. Note that the retrograde well regions 74 are not in contact with each other because during the ion implantation process the patterned resist 70 is present on the hybrid substrate 50.

Figure 2C:
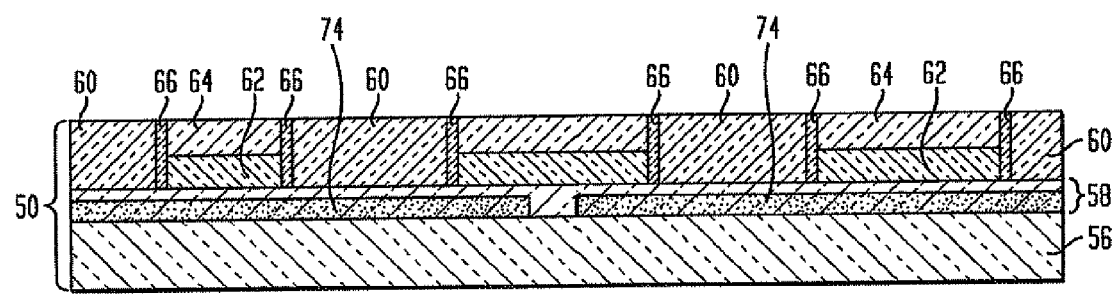
Figure 2D:
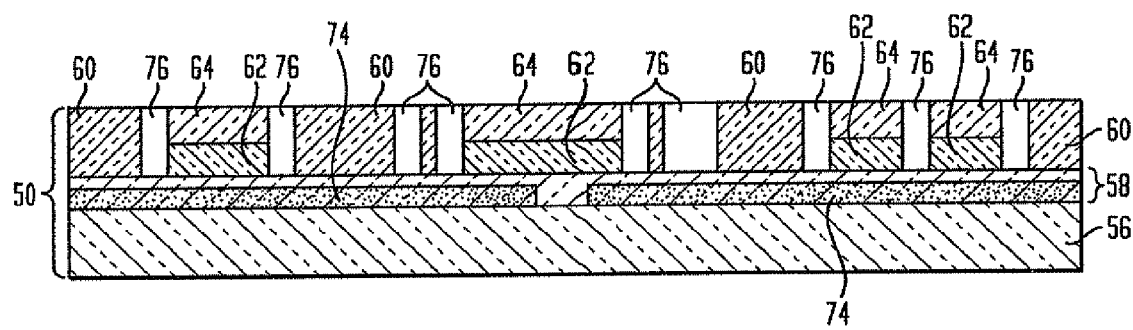

In FIG. 2B, reference numeral 72 denotes the second conductivity type dopants that are implanted into the structure. The second conductivity type dopants that are implanted into the structure are preferably n-type dopants such as phosphorus or arsenic. The ion implantation conditions used in this step of the present invention must be of sufficiently high energy to form retrograde well regions 74 of the second conductivity into portions of the second semiconductor layer 58 as shown in FIG. 2C. Specifically, the retrograde well regions (or doping regions) 74 are created by using an ion implantation energy from about 15 to about 1000 keV, with an ion implantation energy from about 30 to about 300 keV being more typical. The ion implantation is performed to provide a retrograde well region that has a dopant concentration of second conductivity type dopant of about $10^{19}$ atoms/$cm^3$ or greater. A thermal anneal process such as a rapid thermal anneal, laser anneal or spike anneal can follow the ion implantation of the retrograde well dopants. Note that in FIG. 2C the patterned resist 70 has been stripped from the structure after the ion implantation step.

After forming retrograde well regions 74 in the second semiconductor layer 58, an isolation region 76, such as a shallow trench isolation region, is typically formed so as to isolate bulk semiconductor regions 52 from the SOI regions 54 and/or to isolate various portions of each region from itself. The isolation region 76 is formed utilizing processing steps that are well known to those skilled in the art including, for example, trench definition and etching; optionally lining the trench with a diffusion barrier; and filling the trench with a trench dielectric such as an oxide. After the trench fill, the structure may be planarized and an optional densification process step may be performed to densify the trench dielectric. The resultant substantially planar structure containing isolation region 76 is show, for example, in FIG. 2D.

Figure 2E:
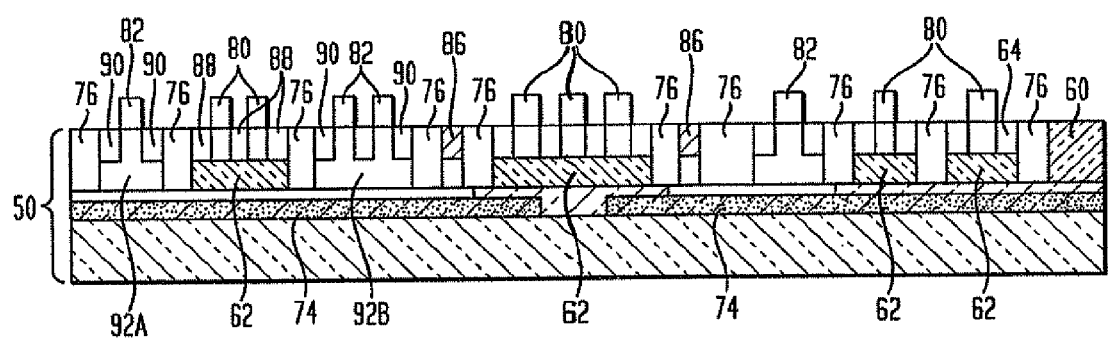

FIG. 2E shows the integrated structure that is formed after a first semiconductor device 80 is formed on a portion of the third semiconductor layer 64 and a second semiconductor device 82 is formed on the regrown semiconductor material 60. Any number of first and second semiconductor devices can be formed atop each of the layers as desired. In accordance with the present invention, the first semiconductor device 80 may be an nFET or a pFET, whereas the second semiconductor device 82 may be a pFET or an nFET, with the proviso that the first semiconductor device 80 is different from the second semiconductor device 82 and that the specific device is fabricated on a crystal orientation that provides a high performance device. In one embodiment of the present and when the third semiconductor layer 64 has a (100) crystal orientations, nFETs are formed on the third semiconductor layer 64, which has SOI properties, and pFETS are formed on the regrown semiconductor material 60.

The pFETs and nFETs are formed utilizing standard CMOS processing steps that are well known to those skilled in the art. Each FET includes a gate dielectric, a gate conductor, an optional hard mask located atop the gate conductor and spacers located on sidewalls of at least the gate conductor. Note that the pFET is typically formed over the semiconductor material that has a (110), or (111) orientation, whereas the nFET is typically formed over a semiconductor surface having a (100), or (111) orientation.

Each FET also includes source/drain diffusion regions that are formed by ion implantation and annealing. In the drawings, reference numeral 88 denotes the source/drain regions (preferably n-source/drain regions) of the second semiconductor device 82 and reference numeral 90 denotes the source/drain diffusion regions (preferably p source/drain regions) of the first semiconductor device 80. Also shown in FIG. 2E are well regions 92A and 92B which represent a first well region and a second well region, respectively, for two adjacent bulk regions 52 that flank a single SOI region 54. The first and second well regions 92A and 92B are preferably n-well regions that are formed utilizing conventional techniques well known in the art. As shown, the two well regions 92A and 92B are electrically coupled by the retrograde well region 74.

The structure shown in FIG. 2E also includes a well contact 86 of said second conductivity type that is formed within one of the isolation regions 76. The well contact 86 is formed by lithography and ion implantation. The well contact 86 may have a graded concentration of dopants of the second conductivity type, with a higher dopant concentration being within an upper portion of the well contact. The well contact 86 is preferably an n-well contact which may be formed by the nFET source/drain ion implantation.

Figure 3A:
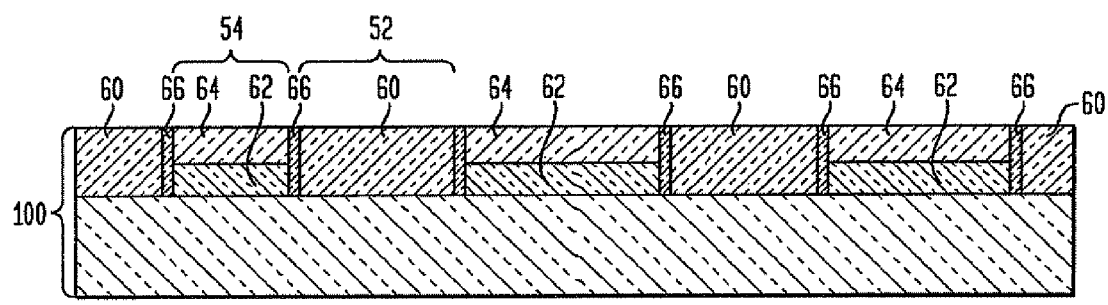
FIGS. 3A-3F are pictorial representations (through cross sectional views) illustrating another embodiment of the present invention.

The process flow depicted in FIGS. 2A-2E show one embodiment of the present invention. FIGS. 3A-3F illustrate a process flow of a second embodiment of the present invention. In the second embodiment, an initial hybrid substrate 100 such as shown in FIG. 3A is first provided. The hybrid substrate 100 includes basically the same materials/components as shown in FIG. 2A except that the second semiconductor layer 58 is omitted. It is observed that the structure shown in FIG. 3A is made using the same basic processing steps as described above in connection with FIG. 2A expect that the second semiconductor layer 58 is not formed atop the first semiconductor layer 56 and bonding occurs between the first semiconductor layer 56 and the oxide layer 62. Growing of the epitaxial semiconductor material 60 occurs atop exposed portions of the first semiconductor layer 56.

Figure 3B:
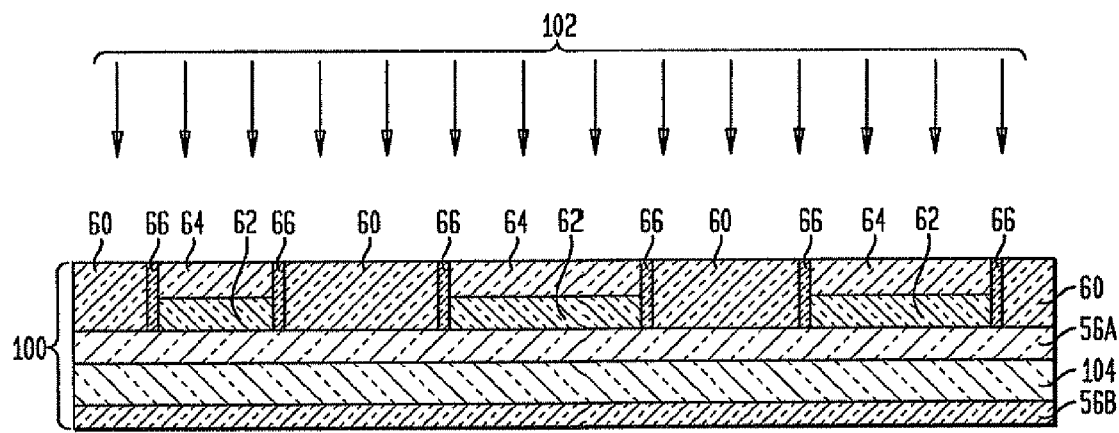

FIG. 3B shows the structure during ion implantation of ions of a first conductivity type (designated by reference numeral 102) into hybrid orientation substrate 100 forming a buried region 104 including said first conductivity ions. The ion implantation is performed utilizing conditions which are capable of forming the buried region 104 into the first semiconductor layer 56 to provide an upper region 56A of the first semiconductor layer and a lower region 56B of the first semiconductor layer. Typically, the ion implantation is performed at an energy from about 13 to about 900 keV, with an energy from about 20 to about 400 keV being more typical. The ion dosage used during this implantation step is capable of forming a buried region 104 that has a concentration of said first conductivity ions from about $10^{18}$ to about $10^{21}$ atoms/$cm^3$, with a concentration of said first conductivity ions from about $2 \times 10^{19}$ to about $5 \times 10^{20}$ atoms/$cm^3$ being more typical.

Figure 3C:
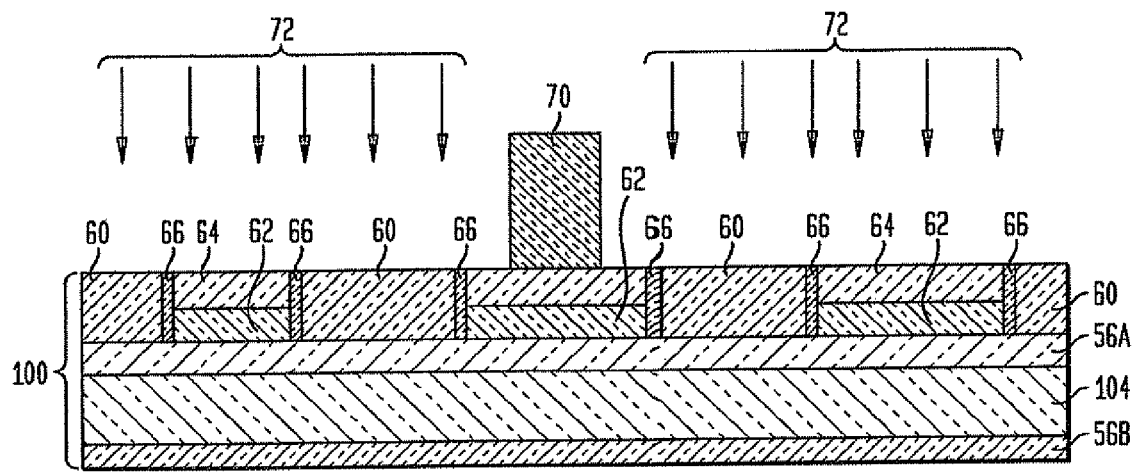
Figure 3D:
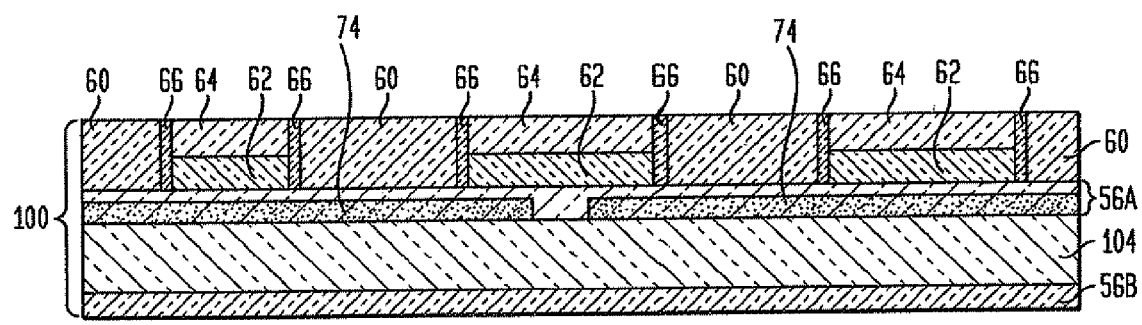

FIGS. 3C and 3D show the structure during ion implantation of the retrograde well regions 74 and after the ion implantation process. The elements and conditions mentioned above for FIGS. 2B and 2C are used in this embodiment of the present invention. It is also observed that since FIGS. 3C and 3D are formed using the same processing steps as described above for FIGS. 2B and 2C, FIGS. 3C and 3D use the same reference numerals as described above in connection with FIGS. 2B and 2C.

Figure 3E:
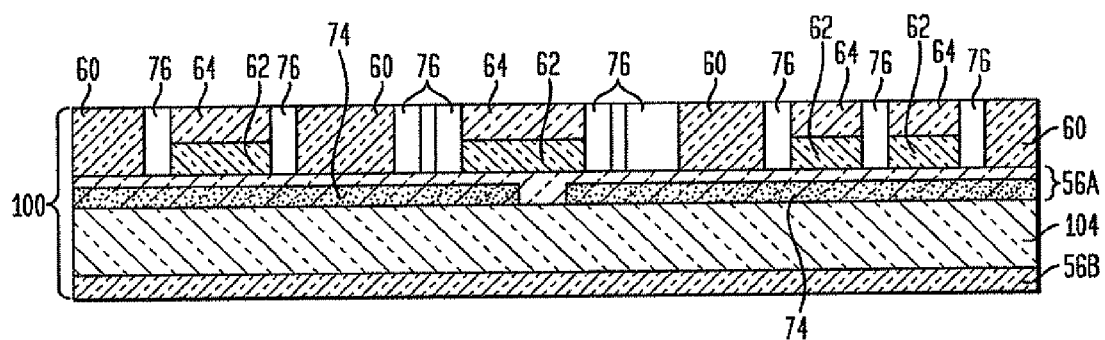

FIG. 3E shows the structure after isolation regions 76 have been formed. It is observed that the isolation regions 76 are formed using the same processing steps as described above for FIG. 2D of the first embodiment of the present invention.

Figure 3F:
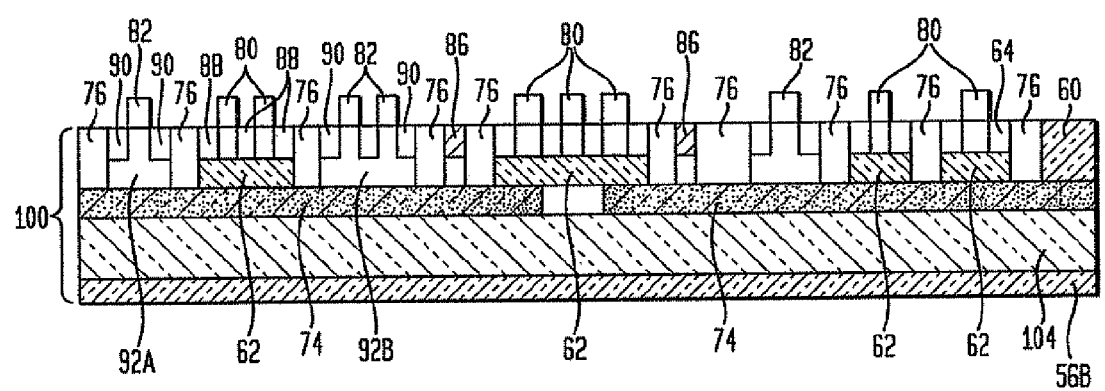

FIG. 3F shows the resultant structure after device fabrication including source/drain diffusion 88 and 90 formation, well region 92A and 92B formation and well contact 86 formation. These formations include the same processing steps as described above for FIG. 2E of the first embodiment of the present invention.

It is observed that the above two embodiments provide a semiconductor structure comprising a hybrid orientated substrate 50 or 100 having at least two coplanar surfaces of different surface crystal orientations, wherein one of said coplanar surfaces has bulk semiconductor properties 52 and the other coplanar surface has semiconductor-on-insulator (SOI) properties 54. The hybrid orientation substrate 50 or 100 includes a new well design that provides a large capacitance from a retrograde well region 74 of the second conductivity type to the substrate thereby providing noise decoupling with a low number of well contacts. Specifically, the two embodiments described above provide a semiconductor structure including a substrate 50 or 100 having a bulk layer of a first conductivity type 56, a portion of which is heavily doped, and including bulk regions 52 and semiconductor-on-insulator regions 54; and a doped region of a second conductivity type 74 abutting the heavily doped portion of said bulk layer 56 and extending from a first of the bulk regions under a first of the semiconductor-on-insulator regions to a second of the bulk regions. In accordance with the present invention, this doped region 74 electrically couples a well region 92A of the first bulk region and a well region 92B of the second bulk region.

In a highly preferred embodiment of the present invention, a strong buried n-well is placed where pFETs are formed, and the n-well is strongly butted to a p+ substrate to provide a large junction capacitance from the n-well to the p+ substrate. Using such a well design, the applicants have obtained experimental data that illustrates one can easily attain an n-well to substrate capacitance of 2 fF/$\mu m^2$ with less than 1 nA/$\mu m^2$ reverse-bias leakage. The p+ (drain to n-well) junction capacitance can be kept to less than 1 fF/$\mu m^2$ and since at most ⅓ of the n-well area will be drains switching, a decoupling ratio of at least 6:1 is assured from the inventive design. This allows a reduction in the frequency placement of n-well contacts, thereby easing migration of designs to hybrid orientation substrates.

While the present invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What we claim is:

1. A method of fabricating a semiconductor structure comprising:
providing a hybrid orientation substrate having at least two coplanar surfaces of different surface crystal orientations, wherein one of said coplanar surfaces is a bulk semiconductor region and the other coplanar surface is a semiconductor-on-insulator (SOI) region;
forming a doped region of a second conductivity type in a bulk layer of a first conductivity type of the hybrid orientation substrate, said doped region is located beneath a buried insulator layer and extending from a first of said bulk regions under a first of said semiconductor-on-insulator regions to a second of said bulk regions; and
forming semiconductor devices on each of said coplanar surfaces of different surface crystal orientations, wherein each semiconductor device in the bulk regions includes a well region, wherein the well region of said first bulk region and the well region of said second bulk region are electrically coupled by said doped region.

2. The method of claim 1, wherein said providing the hybrid orientation substrate includes bonding of two structures, patterning selected regions of the bonded structure, etching exposed portions of the bonded structure and epitaxial growth.

3. The method of claim 1, wherein each of said bulk regions of the hybrid orientation structure includes a first semiconductor layer of a first conductivity type, an optional second semiconductor layer of the first conductivity type and a regrown semiconductor material.

4. The method of claim 1, wherein each of the semiconductor-on-insulator regions includes a first semiconductor layer of a first conductivity type, an optional second semiconductor layer of the first conductivity type, a buried insulator, and a third semiconductor layer.

5. The method of claim 1, wherein said doping region is formed by providing a patterned mask on the hybrid orientation substrate and implanting ions into the hybrid orientation substrate with said patterned mask in place.

6. The method of claim 1, further comprising forming isolation regions between at least each of said bulk regions and semiconductor-on-insulator regions and within at least one of the bulk regions.

7. The method of claim 6, wherein said isolation regions are formed by lithography, etching a trench and filling the trench with a trench dielectric.

8. The method of claim 1, further comprising forming a well contact within at least one of the bulk regions of the hybrid orientation substrate.

9. The method of claim 1, wherein said well contact is a n-well contact.

10. The method of claim 1, wherein said first and second well regions are n-well regions.

11. The method of claim 1, wherein said doped region is a retrograde well region that is formed abutting either a p+ substrate or an ion implanted p+ region of the substrate.

* * * * *